(12) United States Patent
Kim et al.

(10) Patent No.: US 11,394,103 B2
(45) Date of Patent: Jul. 19, 2022

(54) ANTENNA MODULE AND MANUFACTURING METHOD THEREOF

(71) Applicant: SAMSUNG ELECTRO-MECHANICS CO., LTD., Suwon-Si (KR)

(72) Inventors: Doo Il Kim, Suwon-Si (KR); Yong Ho Baek, Suwon-Si (KR); Young Sik Hur, Suwon-Si (KR); Sung Yong An, Suwon-Si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 386 days.

(21) Appl. No.: 15/958,489

(22) Filed: Apr. 20, 2018

(65) Prior Publication Data

US 2019/0027804 A1    Jan. 24, 2019

(30) Foreign Application Priority Data

Jul. 18, 2017 (KR) .................. 10-2017-0091120
Nov. 3, 2017 (KR) .................. 10-2017-0146113

(51) Int. Cl.
*H01Q 1/22* (2006.01)
*H01Q 1/38* (2006.01)
(Continued)

(52) U.S. Cl.
CPC ........... *H01Q 1/2283* (2013.01); *H01L 23/66* (2013.01); *H01L 24/20* (2013.01); *H01Q 1/38* (2013.01);
(Continued)

(58) Field of Classification Search
CPC .............. H01Q 1/2283; H01Q 21/065; H01Q 21/0025; H01Q 19/30; H01Q 1/525;
(Continued)

(56) References Cited

U.S. PATENT DOCUMENTS 6,282,358 B1 * 8/2001 Hornbeck .............. G02B 6/125
                                                                  385/131
6,539,157 B2 * 3/2003 Doi ........................ G02B 6/032
                                                                  385/125
(Continued)

FOREIGN PATENT DOCUMENTS

CN        101390253 A        3/2009
CN        103329349 A        9/2013
(Continued)

OTHER PUBLICATIONS

First Office Action issued in corresponding Chinese Patent Application No. 201810754567.6 dated Apr. 15, 2020, with English translation.
(Continued)

*Primary Examiner* — Dimary S Lopez Cruz
*Assistant Examiner* — Bamidele A Jegede
(74) *Attorney, Agent, or Firm* — Morgan, Lewis & Bockius LLP

(57) ABSTRACT

An antenna module includes a connection member including at least one wiring layer and at least one insulating layer; an integrated circuit (IC) disposed on a first surface of the connection member and electrically connected to the at least one wiring layer; and a plurality of antenna cells each disposed on a second surface of the connection member. Each of the plurality of antenna cells includes an antenna member configured to transmit or receive a radio frequency (RF) signal, a feed via having one end electrically connected to the antenna member and the other end electrically connected to a corresponding wire of the at least one wiring layer, a dielectric layer surrounding side surfaces of the feed via and having a height greater than that of the at least one insulating layer, and a plating member surrounding side surfaces of the dielectric layer.

21 Claims, 22 Drawing Sheets

(51) Int. Cl.
  *H01Q 21/06* (2006.01)
  *H01Q 21/00* (2006.01)
  *H01L 23/66* (2006.01)
  *H01Q 19/30* (2006.01)
  *H01Q 1/52* (2006.01)
  *H01L 23/00* (2006.01)

(52) U.S. Cl.
  CPC ............ *H01Q 1/525* (2013.01); *H01Q 19/30* (2013.01); *H01Q 21/0025* (2013.01); *H01Q 21/065* (2013.01); *H01L 2223/6677* (2013.01); *H01L 2223/6688* (2013.01); *H01L 2224/04105* (2013.01); *H01L 2224/12105* (2013.01); *H01L 2224/24195* (2013.01); *H01L 2224/2518* (2013.01); *H01L 2924/10253* (2013.01); *H01L 2924/10329* (2013.01); *H01L 2924/14* (2013.01); *H01L 2924/1421* (2013.01); *H01L 2924/18162* (2013.01); *H01L 2924/19041* (2013.01); *H01L 2924/19042* (2013.01); *H01L 2924/19043* (2013.01); *H01L 2924/19105* (2013.01); *H01L 2924/3011* (2013.01); *H01L 2924/3025* (2013.01)

(58) Field of Classification Search
  CPC ........ H01Q 1/38; H01Q 1/50; H01Q 21/0006; H01Q 21/0087; H01L 23/66; H01L 24/20; H01L 2224/2518; H01L 2924/19042; H01L 2924/14; H01L 2924/19041; H01L 2924/10253; H01L 2924/19105; H01L 2224/12105; H01L 2924/18162; H01L 2924/3025; H01L 2924/19043; H01L 2224/04105; H01L 2924/10329; H01L 2223/6688; H01L 2224/24195; H01L 2924/3011; H01L 2924/1421; H01L 2223/6677
  See application file for complete search history.

(56) References Cited

U.S. PATENT DOCUMENTS

| | | | | |
|---|---|---|---|---|
| 6,556,168 | B1* | 4/2003 | Marumoto | H01Q 21/065 342/372 |
| 6,791,496 | B1* | 9/2004 | Killen | H01Q 1/38 343/700 MS |
| 7,109,942 | B2 | 9/2006 | McCarville et al. | |
| 9,153,542 | B2* | 10/2015 | Lin | H01L 23/66 |
| 9,711,465 | B2 | 7/2017 | Liao et al. | |
| 2004/0041732 | A1* | 3/2004 | Aikawa | H01Q 9/0457 343/700 MS |
| 2006/0049995 | A1* | 3/2006 | Imaoka | H01Q 1/2283 343/702 |
| 2006/0092079 | A1* | 5/2006 | de Rochemont | H01Q 21/0025 343/895 |
| 2009/0153427 | A1* | 6/2009 | Rofougaran | H01Q 3/24 343/787 |
| 2009/0212887 | A1* | 8/2009 | Rofougaran | H01P 5/185 333/204 |
| 2009/0231225 | A1* | 9/2009 | Choudhury | H04B 7/0682 343/893 |
| 2009/0251356 | A1* | 10/2009 | Margomenos | H01Q 1/3233 342/70 |
| 2009/0256752 | A1* | 10/2009 | Akkermans | H01Q 1/2283 343/700 MS |
| 2009/0315797 | A1* | 12/2009 | Rofougaran | H01Q 9/0407 343/787 |
| 2010/0073255 | A1* | 3/2010 | Noll | H01L 23/66 343/873 |
| 2010/0164783 | A1* | 7/2010 | Choudhury | H01Q 1/02 342/175 |
| 2010/0177012 | A1* | 7/2010 | Morrow | H01Q 21/24 343/893 |
| 2011/0169708 | A1* | 7/2011 | Rofougaran | H01Q 3/24 343/787 |
| 2011/0279190 | A1* | 11/2011 | Liu | H01P 5/028 333/35 |
| 2012/0062439 | A1* | 3/2012 | Liao | H01L 25/16 29/25.01 |
| 2012/0212384 | A1* | 8/2012 | Kam | H01Q 1/2283 343/834 |
| 2012/0249394 | A1* | 10/2012 | Rofougaran | H01Q 3/36 343/850 |
| 2013/0169499 | A1* | 7/2013 | Lin | H01Q 21/205 343/776 |
| 2013/0189935 | A1* | 7/2013 | Nair | H01Q 1/2283 455/90.2 |
| 2013/0292808 | A1* | 11/2013 | Yen | H01L 21/561 257/E23.114 |
| 2014/0145883 | A1* | 5/2014 | Baks | H01L 23/66 343/700 MS |
| 2014/0266947 | A1* | 9/2014 | Chen | H01Q 1/2283 343/772 |
| 2015/0029062 | A1 | 1/2015 | Ng et al. | |
| 2015/0070228 | A1* | 3/2015 | Gu | H01Q 25/00 343/727 |
| 2015/0130681 | A1* | 5/2015 | Hsieh | H01Q 1/38 343/895 |
| 2015/0171033 | A1* | 6/2015 | Seler | H01L 21/565 257/664 |
| 2015/0171523 | A1* | 6/2015 | Kamgaing | H01Q 23/00 343/893 |
| 2015/0249283 | A1* | 9/2015 | Watanabe | H01Q 1/243 343/702 |
| 2015/0280327 | A1* | 10/2015 | Spella | H01Q 19/10 29/601 |
| 2015/0325925 | A1* | 11/2015 | Kamgaing | H01L 21/4853 343/893 |
| 2015/0340765 | A1* | 11/2015 | Dang | H01Q 1/2208 343/893 |
| 2016/0020165 | A1* | 1/2016 | Kamgaing | H01L 23/66 361/679.55 |
| 2016/0049723 | A1* | 2/2016 | Baks | H01Q 13/10 343/848 |
| 2016/0056544 | A1* | 2/2016 | Garcia | H01Q 21/28 343/725 |
| 2016/0087333 | A1* | 3/2016 | Tong | H01Q 1/40 343/873 |
| 2016/0294066 | A1 | 10/2016 | Djerafi et al. | |
| 2017/0033062 | A1* | 2/2017 | Liu | H01L 21/486 |
| 2017/0062953 | A1* | 3/2017 | Teshima | H01Q 9/42 |
| 2017/0170544 | A1 | 6/2017 | Kamgaing | |
| 2017/0186726 | A1* | 6/2017 | Tang | H01L 25/16 |
| 2017/0202083 | A1* | 7/2017 | Baek | H01L 23/49534 |
| 2017/0213794 | A1* | 7/2017 | Baek | H01L 23/5386 |
| 2017/0222316 | A1* | 8/2017 | Mizunuma | H01Q 21/062 |
| 2017/0229769 | A1* | 8/2017 | Yokoyama | H01L 23/66 |
| 2017/0346185 | A1* | 11/2017 | Wang | H01Q 9/065 |
| 2018/0332151 | A1* | 11/2018 | Kamgaing | H01Q 9/0414 |

FOREIGN PATENT DOCUMENTS

| | | |
|---|---|---|
| CN | 103597593 A | 2/2014 |
| CN | 104716122 A | 6/2015 |
| CN | 104867912 A | 8/2015 |
| JP | 2004-015160 A | 1/2004 |
| JP | 2015-008410 A | 1/2015 |
| WO | 2006/039699 A2 | 4/2006 |
| WO | 2012/099739 A1 | 7/2012 |
| WO | 2012/151003 A2 | 11/2012 |

OTHER PUBLICATIONS

Office Action issued in corresponding Taiwanese Application No. 107113765, dated May 31, 2019.
Chinese Office Action dated May 19, 2021 issued in Chinese Patent Application No. 201810754567.6 (with English translation).

(56) References Cited

OTHER PUBLICATIONS

Liu, Er-ping, et al., "A Novel High-efficiency Dual-polarization Cavity-backed Array Antenna," Radio Communications Technology, vol. 41, No. 5, 2015, pp. 64-66.

* cited by examiner

ANTENNA MODULE AND MANUFACTURING METHOD THEREOF

CROSS-REFERENCE TO RELATED APPLICATION(S)

This application claims benefit of priority to Korean Patent Application Nos. 10-2017-0091120 filed on Jul. 18, 2017 and 10-2017-0146113 filed on Nov. 3, 2017 in the Korean Intellectual Property Office, the disclosure of which is incorporated herein by reference in its entirety.

TECHNICAL FIELD

The present disclosure relates to an antenna module and a manufacturing method thereof.

BACKGROUND

Recently, millimeter wave (mmWave) communications including 5th generation (5G) communications have been actively researched, and research into the commercialization of an antenna module able to smoothly implement millimeter wave communications is being actively undertaken.

Conventionally, an antenna module providing a millimeter wave communications environment uses a structure in which an integrated circuit (IC) and an antenna are disposed on a board and are connected to each other by a coaxial cable in order to satisfy a high level of antennal performance (e.g., a transmission and reception rate, a gain, directivity, and the like) according to a high frequency.

However, such a structure may cause a shortage of antenna layout space, a restriction of the degree of freedom of an antenna shape, an increase in interference between the antenna and the IC, and an increase in the size and cost of the antenna module.

SUMMARY

An aspect of the present disclosure may provide an antenna module easily miniaturized while improving transmission and reception performance of a radio frequency (RF) signal using a plurality of antenna cells providing an environment capable of easily securing antenna performance, and a manufacturing method thereof.

According to an aspect of the present disclosure, an antenna module may include a connection member including at least one wiring layer and at least one insulating layer; an integrated circuit (IC) disposed on a first surface of the connection member and electrically connected to the at least one wiring layer; and a plurality of antenna cells each disposed on a second surface of the connection member. Each of the plurality of antenna cells may include an antenna member configured to transmit or receive a radio frequency (RF) signal, a feed via having one end electrically connected to the antenna member and the other end electrically connected to a corresponding wire of the at least one wiring layer, a dielectric layer surrounding side surfaces of the feed via and having a height greater than that of the at least one insulating layer, and a plating member surrounding side surfaces of the dielectric layer.

According to another aspect of the present disclosure, a manufacturing method of an antenna module may include manufacturing a plurality of antenna cells each including an antenna member configured to transmit or receive a radio frequency (RF) signal, a feed via having one end electrically connected to the antenna member, a dielectric layer surrounding side surfaces of the feed via, and a plating member surrounding side surfaces of the dielectric layer; inserting the plurality of antenna cells into an insertion space of an insulating member providing the insertion space of the plurality of antenna cells; and forming a connection member including at least one wiring layer electrically connected to the other end of the feed via and at least one insulating layer having a height shorter than that of the dielectric layer.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Hereinafter, exemplary embodiments of the present disclosure will now be described in detail with reference to the accompanying drawings.

Figure 1:
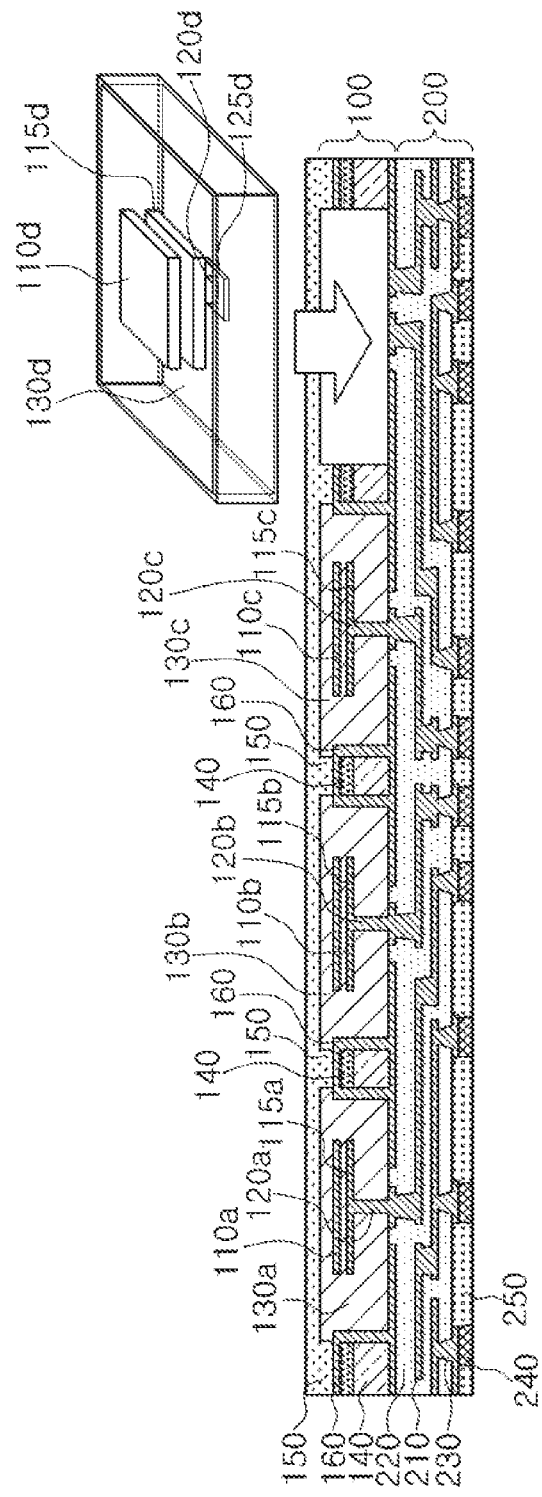
FIG. 1 is a view illustrating an antenna module according to an exemplary embodiment in the present disclosure.

FIG. 1 is a view illustrating an antenna module according to an exemplary embodiment in the present disclosure.

Referring to FIG. 1, an antenna module according to an exemplary embodiment in the present disclosure may have a heterogeneous structure in which an antenna package 100 and a connection member 200 are coupled to each other. That is, the antenna module may be miniaturized while improving antenna performance (e.g., a transmission and reception rate, a gain, directivity, and the like) by utilizing both characteristics that are easy to improve the antenna performance of the antenna package and characteristics that are easy to dispose a circuit pattern or an integrated circuit (IC) of a fan-out package.

The connection member 200 may include at least one wiring layer 210 and at least one insulating layer 220. The connection member 200 may further include a wiring via 230 connected to at least one wiring layer 210, a connection pad 240 connected to the wiring via 230, and a passivation layer 250 and may have a structure similar to a copper redistribution layer (RDL). An insulating member 140 may be disposed on an upper surface of the connection member 200.

The antenna package 100 may include a plurality of antenna cells each including antenna members 115a, 115b, 115c, and 115d configured to transmit or receive a radio frequency (RF) signal, feed vias 120a, 120b, 120c, and 120d in which one end of each thereof is electrically connected to each of the antenna members 115a, 115b, 115c, and 115d and the other end of each thereof is electrically connected to a corresponding wire of at least one wiring layer 210, dielectric layers 130a, 130b, 130c, and 130d surrounding side surfaces of the feed vias 120a, 120b, 120c, and 120d and having a thickness greater than that of at least one insulating layer 220, and a plating member 160 surrounding side surfaces of the dielectric layers 130a, 130b, 130c, and 130d. The plurality of antenna cells may have a block form, but are not limited thereto.

Referring to FIG. 1, each of the plurality of antenna cells may be disposed on an upper surface of the connection member 200. At least a portion of the plurality of antenna cells may be each inserted into a plurality of insertion spaces provided by the insulating member 140. For example, the antenna cell may include an electrical connection structure 125d and the electrical connection structure 125d may electrically connect between one end of a corresponding feed via 120d and a corresponding wire of at least one wiring layer 210 simultaneously with the insertion of the antenna cell. For example, the electrical connection structure 125d may be implemented as electrodes, pins, solder balls, lands, and the like.

That is, since the plurality of antenna cells may be manufactured independently from the connection member 200, the plurality of antenna cells may have boundary conditions (e.g., small manufacturing tolerance, a short electrical length, a smooth surface, a large size of a dielectric layer, an adjustment of a dielectric constant, and the like) advantageous in securing a radiation pattern.

For example, the dielectric layers 130a, 130b, 130c, and 130d included in the plurality of antenna cells may have a dielectric constant Dk (e.g., a dissipation factor Df) greater than that of at least one insulating layer 220 or may have a dielectric constant greater than that of the insulating member 140. Typically, it is difficult to apply a material having a high dielectric constant to a process of manufacturing an antenna module. As the dielectric layers 130a, 130b, 130c, and 130d included in the plurality of antenna cells are manufactured independently, the dielectric layers may easily have a higher dielectric constant. Further, the high dielectric constant of the dielectric layers 130a, 130b, 130c, and 130d may reduce an overall size of the antenna module as well as antenna performance.

For example, the dielectric layers 130a, 130b, 130c, and 130d, the insulating member 140, and at least one insulating layer 220 may be formed of a thermosetting resin such as an epoxy resin, a thermoplastic resin such as a polyimide resin, a resin in which the thermosetting resin or the thermoplastic resin is impregnated together with an inorganic filler in a core material such as a glass fiber (or a glass cloth or a glass fabric), for example, prepreg, Ajinomoto Build up Film (ABF), FR-4, Bismaleimide Triazine (BT), a photo imagable dielectric (PID) resin, generic copper clad laminate (CCL), or a glass or ceramic based insulating material.

In a case in which the dielectric constant of the dielectric layers 130a, 130b, 130c, and 130d and the dielectric constant of the insulating member 140 are implemented to be different from each other, the dielectric layers 130a, 130b, 130c, and 130d may be formed of glass, ceramic, silicon, or the like having Dk of 5 or more, and the insulating member 140 and at least one insulating layer 220 may be formed of copper clad laminate (CCL) or prepreg having relatively low Dk.

In addition, the plurality of antenna cells may improve isolation on other antennal cells while having the boundary conditions advantageous in securing the radiation pattern by using the plating member 160. The plating member 160 may be designed more freely and efficiently by being manufactured together when the plurality of antenna cells are manufactured independently.

For example, the plating member 160 may be designed to cover at least a portion of a lower surface as well as side surfaces of the antenna cell, thereby improving isolation on the connection member or the IC.

In addition, the plurality of antenna cells may include director members 110a, 110b, 110c, and 110d disposed to be spaced apart from each other in a direction of an upper surface of each of the antenna members 115a, 115b, 115c, and 115d and configured to transmit or receive the RF signal together with the antenna members 115a, 115b, 115c, and 115d. The plurality of antenna cells may easily provide a layout space of the director members 110a, 110b, 110c, and 110d.

For example, a gain or bandwidth of the antenna module may be large as the number of director members 110a, 110b, 110c, and 110d is increased, but since a height of each of the dielectric layers 130a, 130b, 130c, and 130d may be increased as the number of director members 110a, 110b, 110c, and 110d is increased, implementation difficulty of the dielectric layers 130a, 130b, 130c, and 130d may be increased. However, since the plurality of antenna cells may be manufactured independently from the connection member 200, the plurality of antenna cells may easily implement the dielectric layers 130a, 130b, 130c, and 130d having the height higher than that of the insulating member 140 and may easily include the director members 110a, 110b, 110c, and 110d.

Depending on a design, since the plurality of antenna cells may be manufactured independently from each other, the plurality of antenna cells may be designed to have different characteristics. For example, each of the plurality of antenna cells may include each of the dielectric layers formed of different materials to have different dielectric constants. Here, an antenna cell having a relatively high dielectric constant may be disposed at a position close to the center of the antenna module, and an antenna cell having relatively high durability may be disposed at a position close to an edge of the antenna module.

After the plurality of antenna cells are disposed on the upper surface of the connection member 200, an encapsulation member 150 may be disposed on the plurality of antenna cells. When the encapsulation member 150 is applied in a liquid state, the encapsulation member 150 may permeate between the plurality of antenna cells or may permeate between the plurality of antenna cells and the insulating member 140. After the encapsulation member 150 permeates, the encapsulation member 150 may be cured to a solid state. Therefore, the encapsulation member 150 may improve structural stability of the antenna module despite the insertion of the plurality of antenna cells. Meanwhile, the encapsulation member 150 may be formed of a photo imagable encapsulant (PIE), Ajinomoto build-up film (ABF), or the like, but is not limited thereto.

Figure 2A:
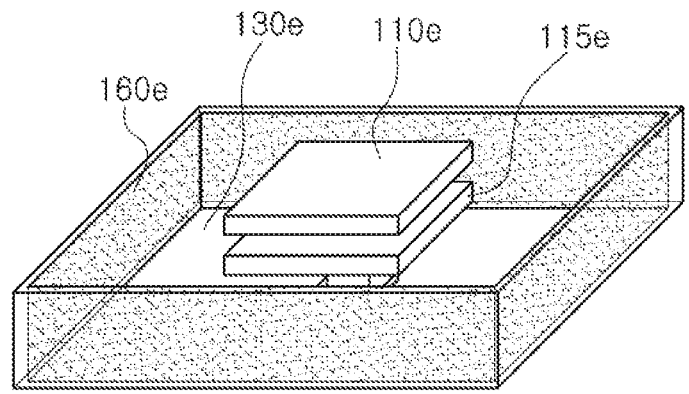
FIGS. 2A through 2C are views each illustrating an example of an antenna cell of an antenna module.
Figure 2B:
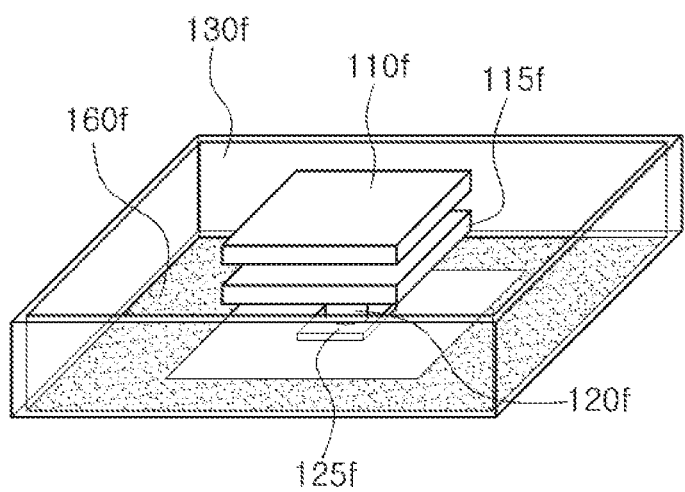
Figure 2C:
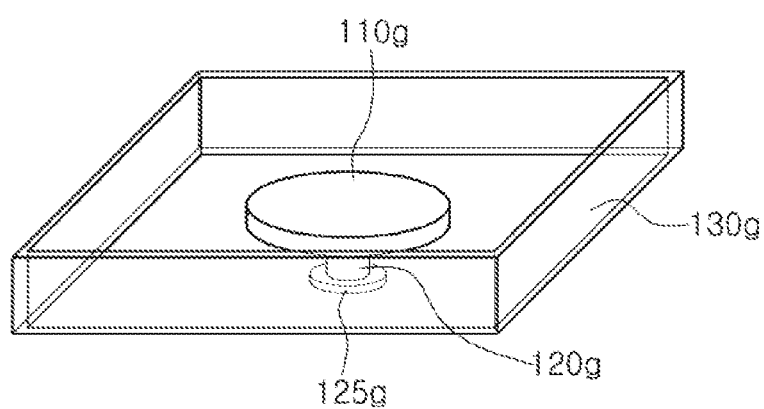

FIGS. 2A through 2C are views each illustrating an example of an antenna cell of an antenna module.

Referring to FIG. 2A, an antenna cell may include at least portions of a director member 110e, an antenna member 115e, a feed via, an electrical connection structure, a dielectric layer 130e, and a plating member 160e. Here, the plating member 160e may be disposed to surround only side surfaces of the antenna cell. That is, a lower surface of the antenna cell may be covered by a ground pattern disposed on the upper surface of the connection member.

Referring to FIG. 2B, the antenna cell may include at least portions of a director member 110f, an antenna member 115f, a feed via 120f, an electrical connection structure 125f, a dielectric layer 130f, and a plating member 160f. Here, the plating member 160f may be disposed to cover only a portion of the lower surface of the antenna cell. That is, the side surfaces of the antenna cell may be surrounded by the plating member disposed on side surfaces of an insulating member on the connection member.

Referring to FIG. 2C, the antenna cell may include at least portions of an antenna member 110g, a feed via 120g, an electrical connection structure 125g, and a dielectric layer 130g. That is, the side surfaces of the antenna cell may be surrounded by the plating member disposed on the side surfaces of the insulating member on the connection member, and the lower surface of the antenna cell may be covered by the ground pattern disposed on the upper surface of the connection member.

Meanwhile, a shape of each of the antenna members 115e, 115f, and 110g may be a polygonal shape or a circular shape, but is not limited thereto.

Figure 3A:
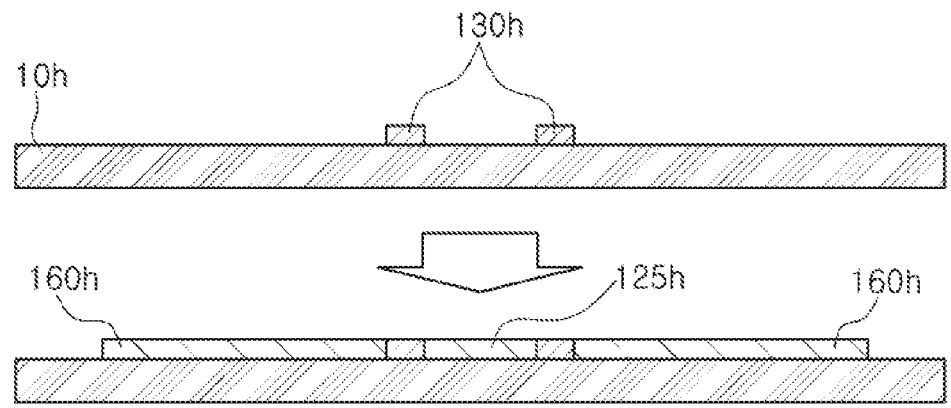
FIG. 3A is a view illustrating a formation of a lower surface plating member and an electrical connection structure of an antenna cell.
Figure 3B:
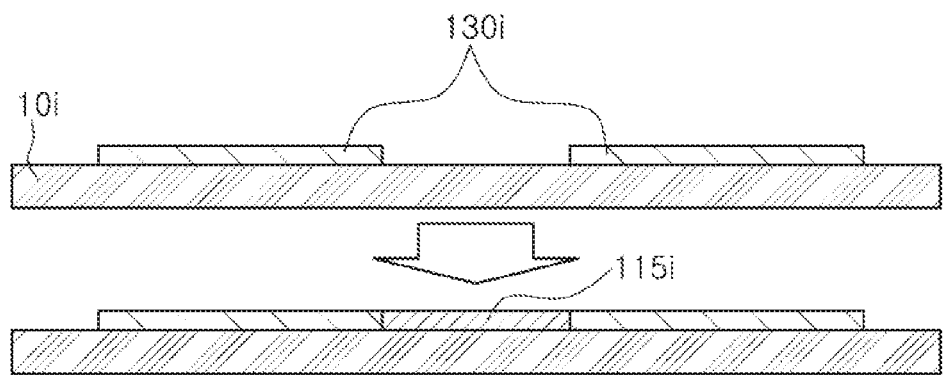
FIG. 3B is a view illustrating a formation of an antenna member of an antenna cell.
Figure 3C:
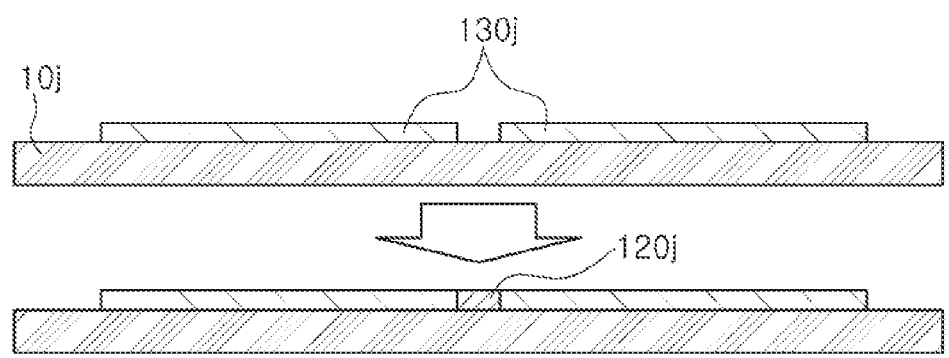
FIG. 3C is a view illustrating a formation of a feed via of an antenna cell.

FIG. 3A is a view illustrating a formation of a lower surface plating member and an electrical connection structure of an antenna cell, FIG. 3B is a view illustrating a formation of an antenna member of an antenna cell, and FIG. 3C is a view illustrating a formation of a feed via of an antenna cell.

Referring to FIG. 3A, a dielectric layer 130h, an electrical connection structure 125h, and a plating member 160h may be disposed on a base 10h. For example, the electrical connection structure 125h and the plating member 160h may be formed according to a negative or positive printing method, and may include a metal material (e.g., a conductive material such as copper (Cu), aluminum (Al), silver (Ag), tin (Sn), gold (Au), nickel (Ni), lead (Pb), titanium (Ti), or an alloy thereof).

Referring to FIG. 3B, a dielectric layer 130i and an antenna member 115i may be disposed on a base 10i. For example, the antenna member 115i may be formed according to a negative or positive printing method. The director member may also be formed in the same way as the antenna member 115i.

Referring to FIG. 3C, a dielectric layer 130j and a feed via 120j may be disposed on a base 10j. For example, the feed via 120j may be formed according to a negative or positive printing method, and may be repeatedly stacked.

Meanwhile, the antenna member 115i, the feed via 120j, the electrical connection structure 125h, and the plating member 160h may be formed by a plating method such as chemical vapor deposition (CVD), physical vapor deposition (PVD), sputtering, subtractive, additive, semi-additive process (SAP), modified semi-additive process (MSAP), or the like, but is not limited thereto.

FIGS. 3D through 3G are views illustrating a process of manufacturing an antenna cell of an antenna module.

Figure 3D:
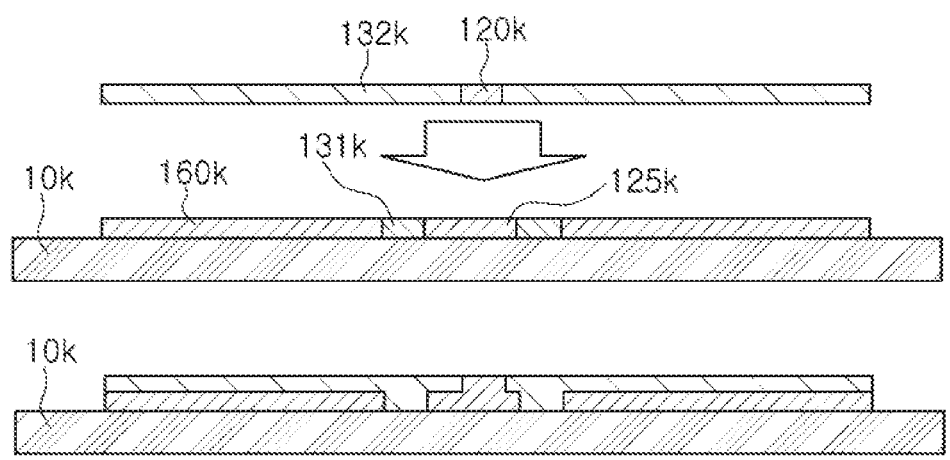
FIGS. 3D through 3G are views illustrating a process of manufacturing an antenna cell of an antenna module.

Referring to FIG. 3D, a first layer including a dielectric layer 131k, an electrical connection structure 125k, and a plating member 160k may be disposed on a base 10k, and a second layer including a feed via 120k and a dielectric layer 132k may be disposed on the first layer.

Figure 3E:
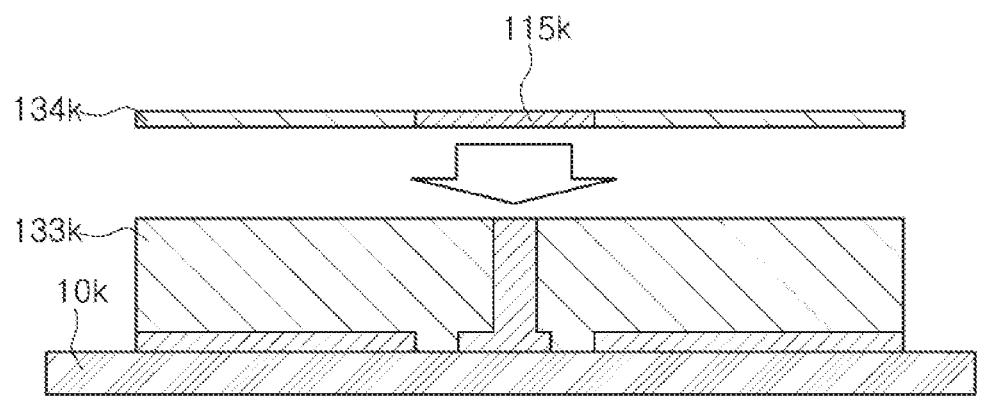

Referring to FIG. 3E, a third layer to a n-th layer each including a feed via and a dielectric layer 133k may be repeatedly stacked, and a (n+1)-th layer including an antenna member 115k and a dielectric layer 134k may be disposed on the n-th layer.

Figure 3F:
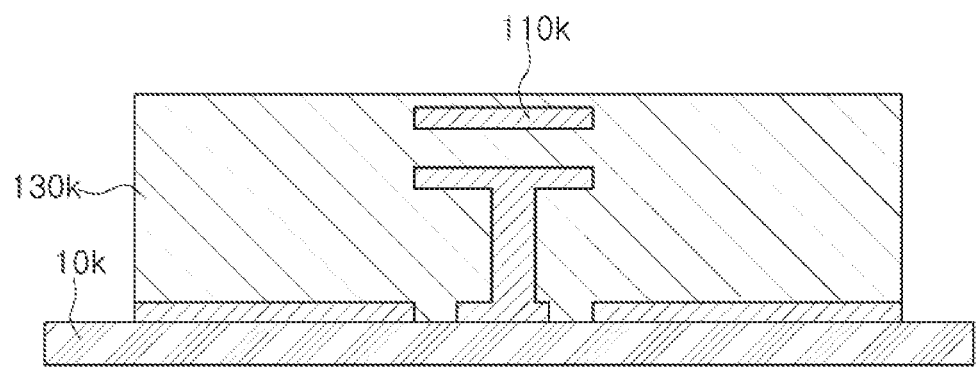

Referring to FIG. 3F, a (n+2)-th layer including a director member 110k may be disposed on the (n+1)-th layer. All of the dielectric layers included in the first layer to the (n+2)-th layer may be integrated into a single dielectric layer 130k.

Figure 3G:
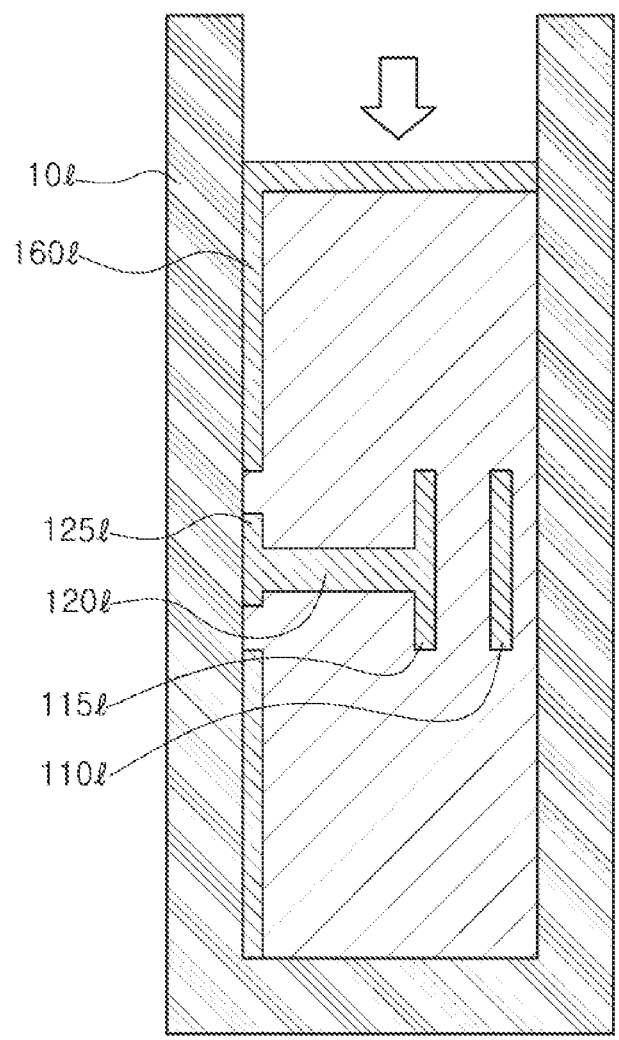

Referring to FIG. 3G, an antenna cell in which portions of a director member 110l, an antenna member 115l, a feed via 120l, an electrical connection structure 125l, and a plating member 160l are formed may be inserted into a U-shaped base 10l, and other portions of the plating member 160l may be then formed. The antenna cell may be re-inserted into the U-shaped base 10l in a rotated state, and the remaining portions of the plating member 160l may be then formed. Meanwhile, the U-shaped base 10l may be a jig, but is not limited thereto.

FIGS. 4A through 4F are views illustrating a manufacturing method of an antenna module according to an exemplary embodiment in the present disclosure.

Figure 4A:
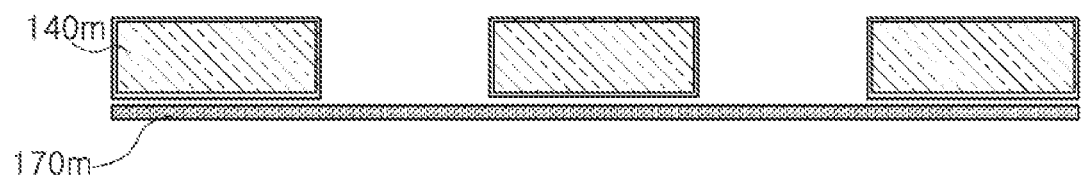
FIGS. 4A through 4F are views illustrating a manufacturing method of an antenna module according to an exemplary embodiment in the present disclosure.

Referring to FIG. 4A, a portion of an insulating member 140m may be etched to provide an insertion space into which the plurality of antenna cells are inserted, and a film 170m may be disposed below the insulating member 140m.

Figure 4B:
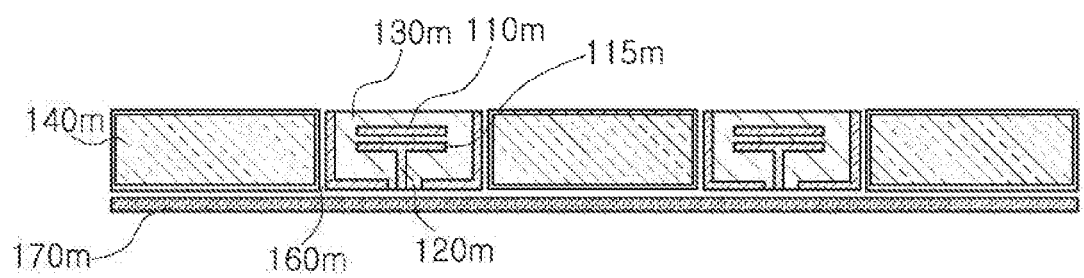

Referring to FIG. 4B, an antenna cell including a director member 110m, an antenna member 115m, a feed via 120m, a dielectric layer 130m, and a plating member 160m may be inserted into the insertion space of the insulating member 140m.

Figure 4C:
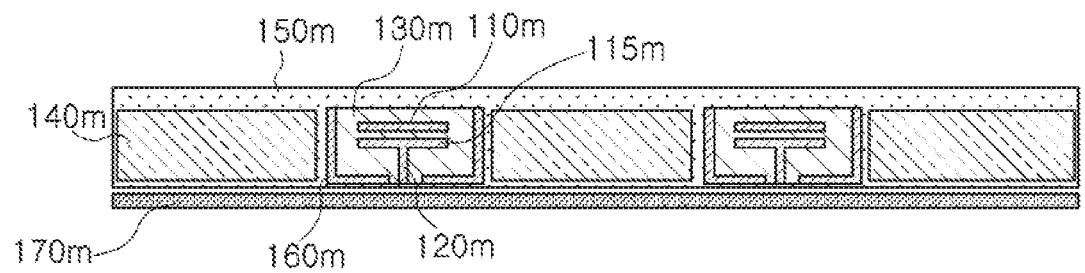

Referring to FIG. 4C, an encapsulation member 150m may be disposed on the antenna cell and the insulating member 140m. The encapsulation member 150m may permeate between the antenna cell and the insulating member 140m.

Figure 4D:
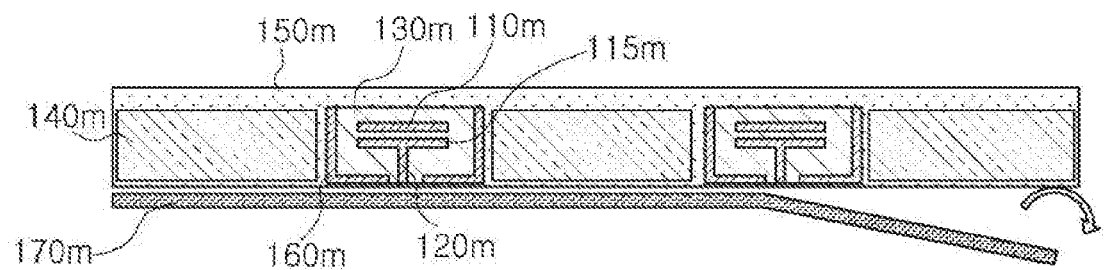

Referring to FIG. 4D, the film 170m may be removed after the encapsulation member 150m is cured.

Figure 4E:
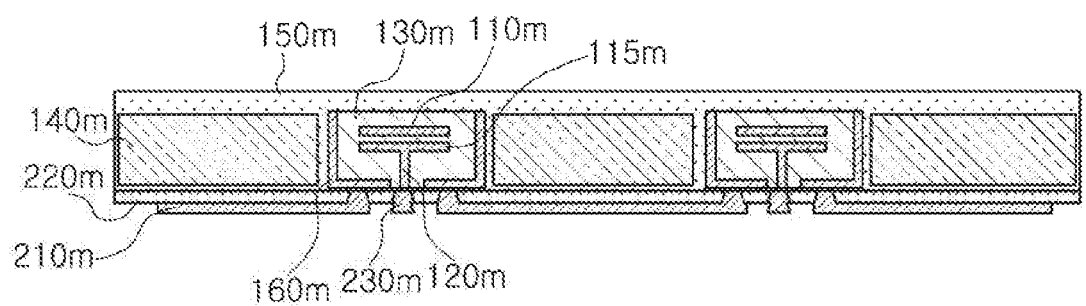

Referring to FIG. 4E, a connection member including at least one wiring layer 210m, at least one insulating layer 220m, and a wiring via 230m may be formed below the antenna cell. For example, the connection member may be attached to a lower end of the antenna cell after at least one wiring layer 210m is formed so as to correspond to a layout position of the antenna cell.

Figure 4F:
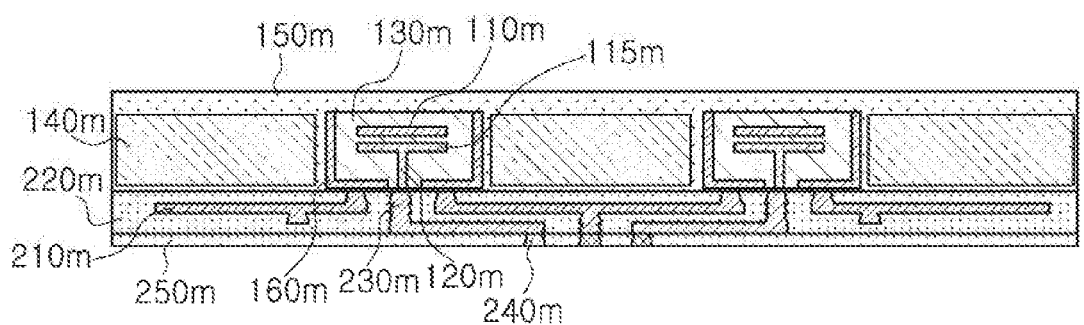

Referring to FIG. 4F, a connection pad 240m may be connected to the wiring via 230m, and a passivation layer 250m may cover the lower end of the connection member.

Figure 5:
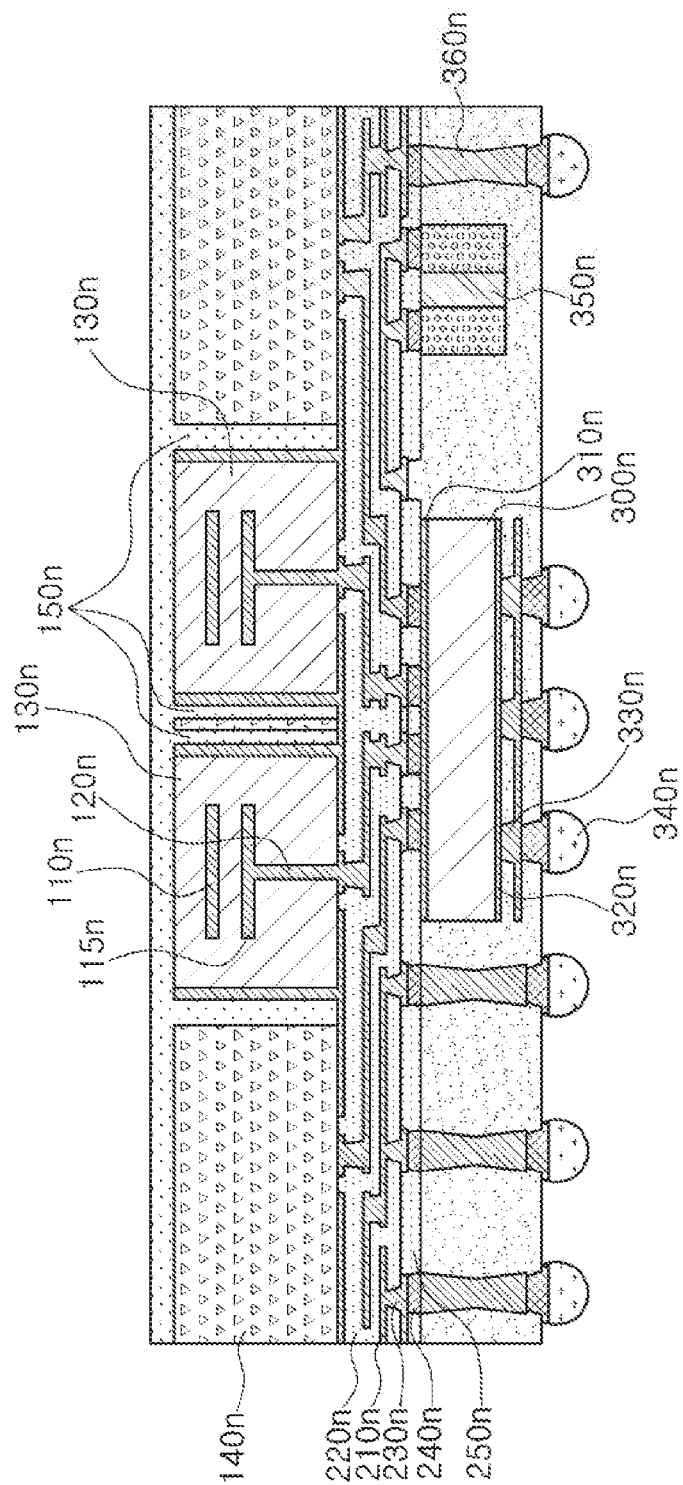
FIGS. 5 through 7 are views illustrating another example of an antenna module according to an exemplary embodiment in the present disclosure.
Figure 6:
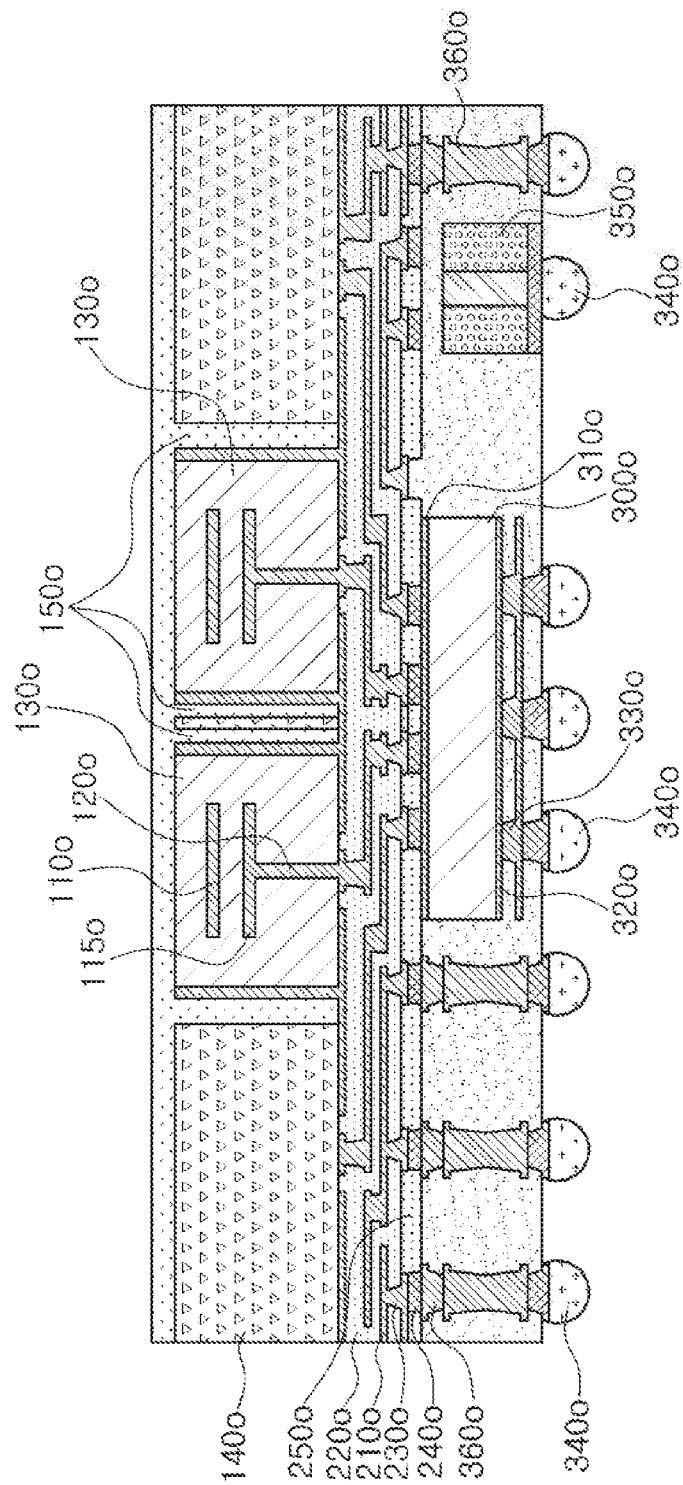
Figure 7:
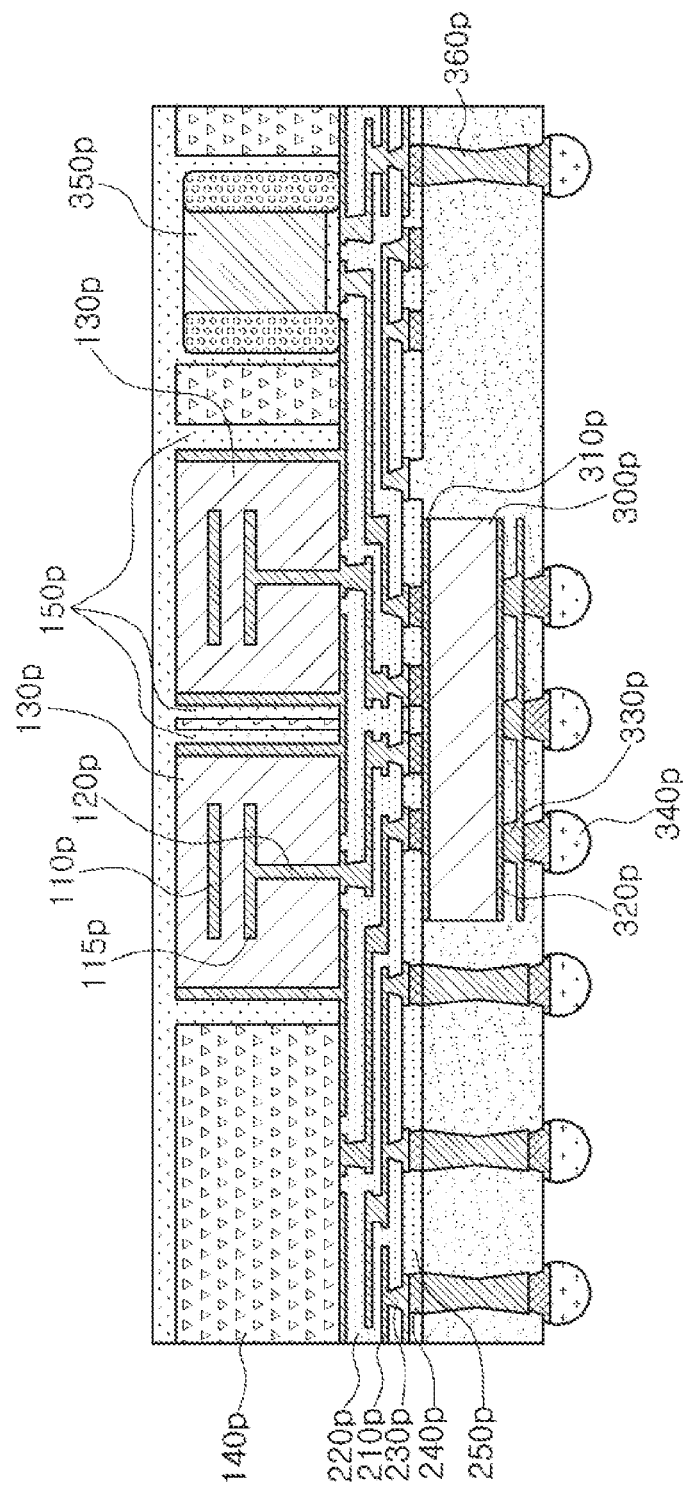

FIGS. 5 through 7 are views illustrating another example of an antenna module according to an exemplary embodiment in the present disclosure.

Referring to FIG. 5, an antenna cell including a director member 110n, an antenna member 115n, a feed via 120n, and a dielectric layer 130n, and an insulating member 140n may be disposed on an upper surface of a connection member including at least one wiring layer 210n, at least one insulating layer 220n, a wiring via 230n, a connection pad 240n, and a passivation layer 250n. An encapsulation member 150n may be disposed on the antenna cell and the insulating member 140n. The encapsulation member 150n may permeate between the antenna cell and the insulating member 140n.

An RF signal may be transmitted to the antenna cell through at least one wiring layer 210n and transmitted in a direction of an upper surface of the antenna module, and the RF signal received by the antenna cell may be transmitted to an IC 300n through at least one wiring layer 210n.

The IC 300n may include an active surface 310n and an inactive surface 320n. The IC 300n may be electrically connected to the connection pad 240n through the active surface 310n and disposed on a lower surface of the connection member. That is, since the IC 300n may be disposed to be faced-up, an electrical distance up to the antenna member 115n may be reduced and transmission loss of the RF signal may be reduced.

The inactive surface 320n of the IC 300n may be connected to a metal member 330n. The metal member 330n may radiate heat generated from the IC 300n or provide a ground to the IC 300n.

A passive component 350n may be electrically connected to the connection pad 240n and disposed on the lower surface of the connection member, and may provide impedance to the IC 300n or the antenna cell. For example, the passive component 350n may include at least a portion of a multilayer ceramic capacitor (MLCC), an inductor, or a chip resistor.

One end of a core via 360n may be electrically connected to the connection pad 240n and disposed on the lower surface of the connection member, and the other end of the core via 360n may be connected to an electrical connection structure 340n.

For example, the core via 360n may receive a base signal (e.g., power, a low frequency signal, or the like) from the electrical connection structure 340n and provide the base signal to the IC 300n. The IC 300n may generate an RF signal of a millimeter wave (mmWave) band by performing a frequency conversion, amplification, and a filtering phase control using the base signal and transmit the RF signal to the antenna cell. For example, a frequency of the RF signal may be 28 GHz and/or 36 GHz, but is not limited thereto and may be varied according to a communications scheme of the antenna module.

Meanwhile, the IC 300n and the passive component 350n may be encapsulated by an encapsulant.

Referring to FIG. 6, an antenna cell including a director member 110o, an antenna member 115o, a feed via 120o, and a dielectric layer 130o, and an insulating member 140o may be disposed on an upper surface of a connection member including at least one wiring layer 210o, at least one insulating layer 220o, a wiring via 230o, a connection pad 240o, and a passivation layer 250o. An encapsulation member 150o may be disposed on the antenna cell and the insulating member 140o. The encapsulation member 150o may permeate between the antenna cell and the insulating member 140o.

An IC 300o including an active surface 310o and an inactive surface 320o may be electrically connected to the connection pad 240o and disposed on the lower surface of the connection member. The inactive surface 320o may be connected to a metal member 330o.

The IC 330o may be formed of a compound semiconductor (e.g., GaAs) or formed of a silicon semiconductor in consideration of high frequency characteristics.

The IC 300o may be encapsulated by an encapsulant. The encapsulant may protect the IC 300o from external electrical/physical/chemical impact, and may be formed of a photo imagable encapsulant (PIE), Ajinomoto build-up film (ABF), epoxy molding compound (EMC), or the like, but is not limited thereto.

An electrical connection structure 340o may be disposed on a lower surface of the encapsulant.

A passive component 350o may be connected to the electrical connection structure 340o.

One end and the other end of a core via 360o may be each connected to a core wiring layer, and the core wiring layer may be each connected to the connection pad 240o or the electrical connection structure 340o and laterally extend to be also connected to the other core via 360o.

Referring to FIG. 7, an antenna cell including a director member 110p, an antenna member 115p, a feed via 120p, and a dielectric layer 130p, and an insulating member 140p may be disposed on an upper surface of a connection member including at least one wiring layer 210p, at least one insulating layer 220p, a wiring via 230p, a connection pad 240p, and a passivation layer 250p. An encapsulation member 150p may be disposed on the antenna cell and the insulating member 140p. The encapsulation member 150p may permeate between the antenna cell and the insulating member 140p.

An IC 300p including an active surface 310p and an inactive surface 320p may be electrically connected to the connection pad 240p and disposed on the lower surface of the connection member. The inactive surface 320p may be connected to a metal member 330p.

The IC 300p may be encapsulated by an encapsulant and an electrical connection structure 340p may be disposed on a lower surface of the encapsulant. The electrical connection structure 340p may be connected to a core via 360p.

Since the antenna cell is manufactured independently and is then disposed on the upper surface of the connection member, the insulating member 140p may be more freely machined and may include an accommodation space.

A passive component 350p may be disposed in the accommodation space of the insulating member 140p.

Accordingly, a size of the lower surface of the connection member in the antenna module may be reduced, and impedance provided to the antenna member 115p by the passive component 350 may be more accurately matched.

Meanwhile, a second antenna member (not shown) configured to transmit or receive a second RF signal in a side surface direction of the antenna module may also be disposed in the accommodation space of the insulating member 140p. The second antenna member may be implemented as a dipole antenna or a monopole antenna.

Meanwhile, the components (the ICs, the encapsulants, the passive components, the core vias, and the like) disposed on the lower surface of the connection member illustrated in FIGS. 5 through 7 may be manufactured independently like a fan-out semiconductor package and may be then bonded to the connection member, and may be manufactured together with the connection member without a bonding process depending on a design.

Figure 8:
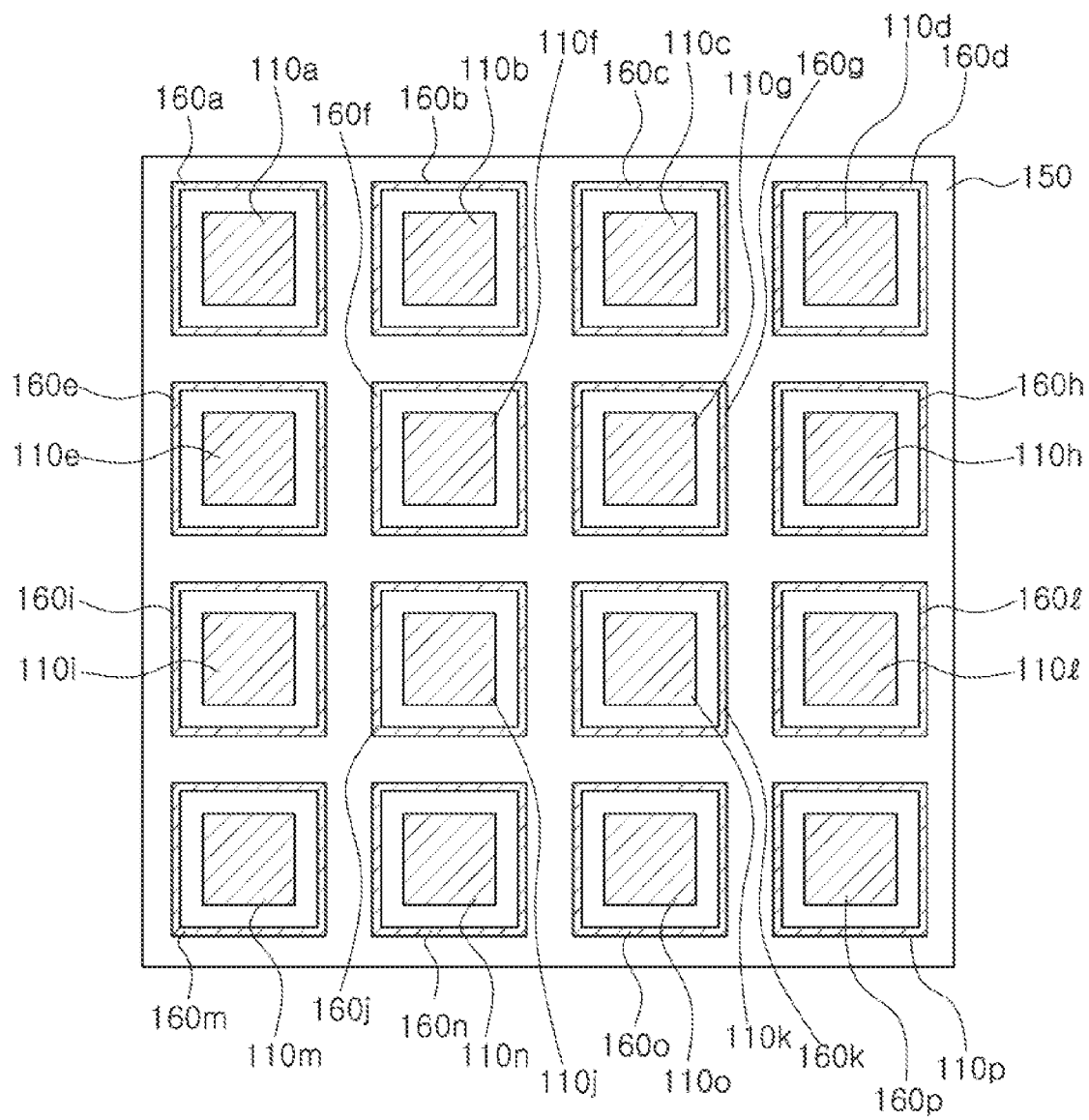
FIG. 8 is a schematic view illustrating an upper surface of an example of an antenna module according to an exemplary embodiment in the present disclosure.

FIG. 8 is a schematic view illustrating an upper surface of an example of an antenna module according to an exemplary embodiment in the present disclosure.

Referring to FIG. 8, each of a plurality of director members 110a, 110b, 110c, 110d, 110e, 110f, 110g, 110h, 110i, 110j, 110k, 110l, 110m, 110n, 110o, and 110p may have a form of a patch antenna and may be surrounded by a corresponding plating member of a plurality of plating members 160a, 160b, 160c, 160d, 160e, 160f, 160g, 160h, 160i, 160j, 160k, 160l, 160m, 160n, 160o, and 160p. If the antenna module does not include the director members, the plurality of director members 110a, 110b, 110c, 110d, 110e, 110f, 110g, 110h, 110i, 110j, 110k, 110l, 110m, 110n, 110o, and 110p may be replaced with a plurality of antenna members.

Figure 9:
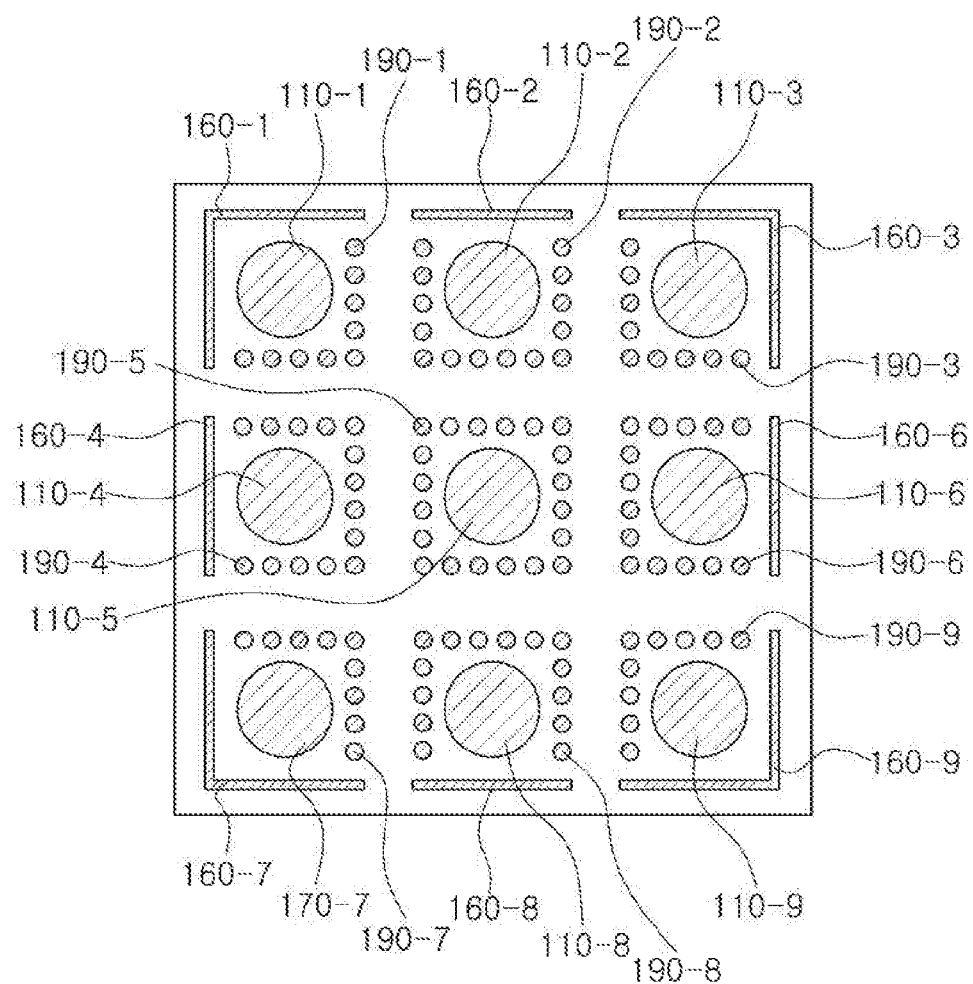
FIG. 9 is a schematic view illustrating an upper surface of another example of an antenna module according to an exemplary embodiment in the present disclosure.

FIG. 9 is a schematic view illustrating an upper surface of another example of an antenna module according to an exemplary embodiment in the present disclosure.

Referring to FIG. 9, each of a plurality of director members 110-1, 110-2, 110-3, 110-4, 110-5, 110-6, 110-7, 110-8, and 110-9 may be surrounded by at least one of corresponding plating members 160-1, 160-2, 160-3, 160-4, 160-6, 160-7, 160-8, and 160-9, and a plurality of shielding vias 190-1, 190-2, 190-3, 190-4, 190-5, 190-6, 190-7, 190-8, and 190-9. If the antenna module does not include the director members, the plurality of director members 110-1, 110-2, 110-3, 110-4, 110-5, 110-6, 110-7, 110-8, and 110-9 may be replaced with a plurality of antenna members.

That is, a portion of side surfaces of the plurality of antenna cells disposed on the connection member of the antenna module may be surrounded by the plurality of shielding vias instead of the plating member.

Meanwhile, the number, layout, and shape of the plurality of director members or the plurality of antenna members illustrated in FIGS. 8 and 9 are not particularly limited. For example, the shape of the plurality of director members illustrated in FIG. 8 may be circular, and the number of the plurality of director members illustrated in FIG. 9 may be four.

Meanwhile, the lower end (corresponding to the IC, the encapsulant, the passive component, and the core via) of the connection member disclosed in the present specification may be implemented according to a fan-out semiconductor package. To facilitate understanding of the fan-out semiconductor package, a description will be made with reference to FIGS. 10 through 17.

Figure 10:
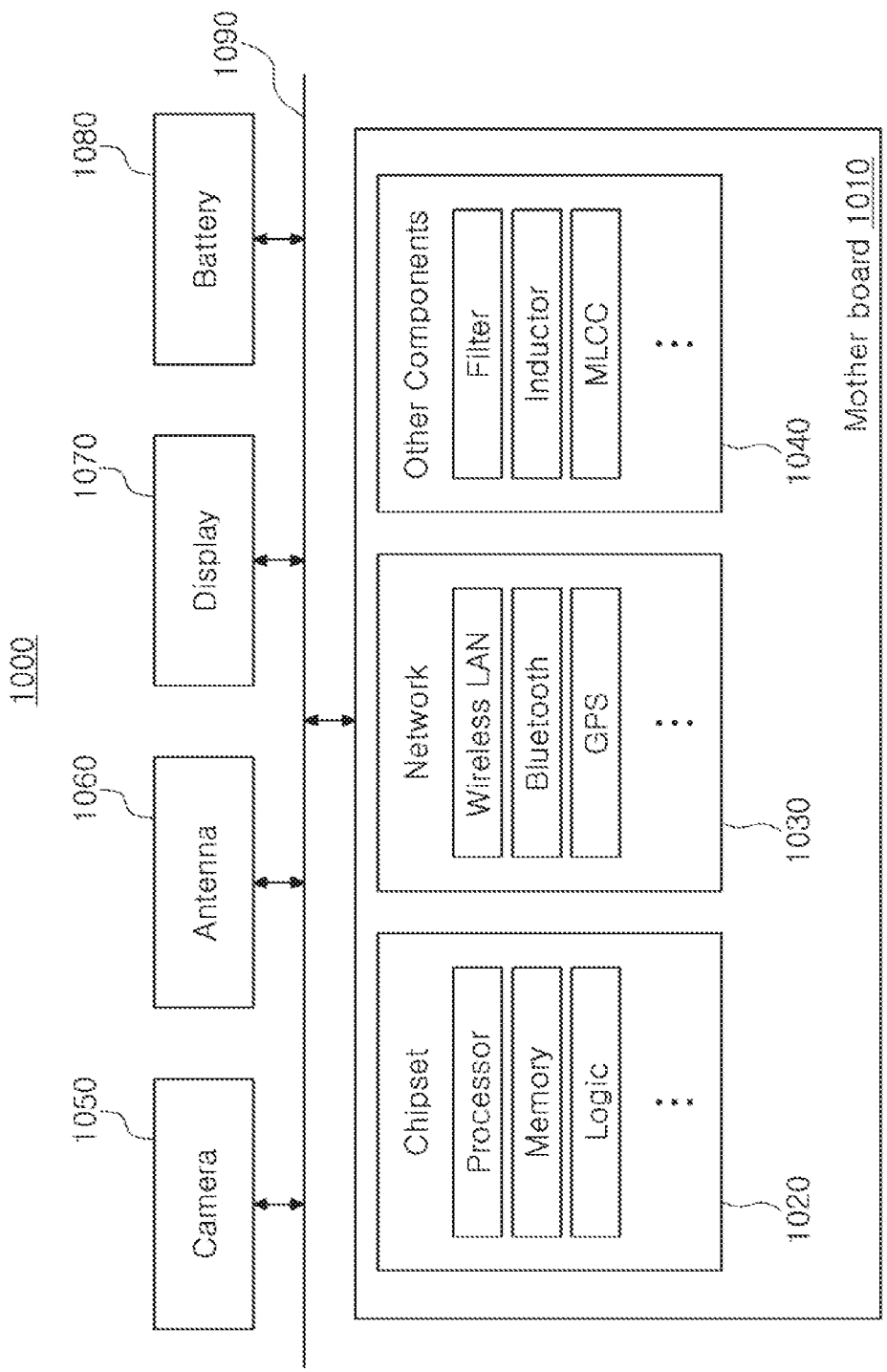
FIG. 10 is a schematic block diagram illustrating an example of an electronic device system.

FIG. 10 is a schematic block diagram illustrating an example of an electronic device system.

Referring to FIG. 10, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 11:
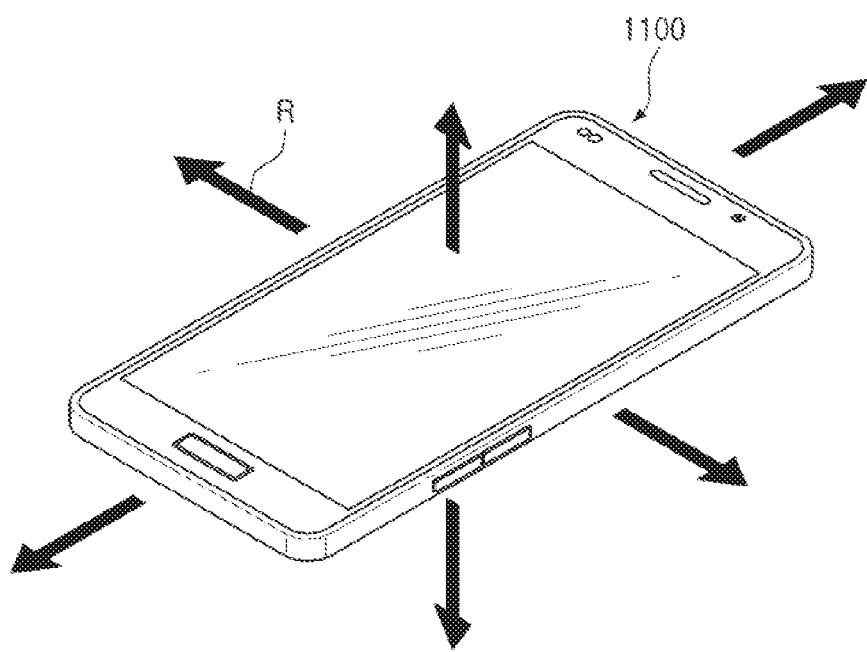
FIG. 11 is a schematic perspective view illustrating an example of an electronic device.

FIG. 11 is a schematic perspective view illustrating an example of an electronic device.

Referring to FIG. 11, an electronic device may be, for example, a smartphone 1100. In the smartphone 1100, a radio frequency integrated circuit (RFIC) may be used in a semiconductor package form, and an antenna may be used in a substrate or module form. The RFIC and the antenna may be electrically connected to each other in the smartphone 1100, and radiation R of antenna signals in various directions may be thus possible. A semiconductor package including the RFIC and a substrate or a module including the antenna may be used in various forms in an electronic device such as the smartphone, or the like.

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Figure 12B:
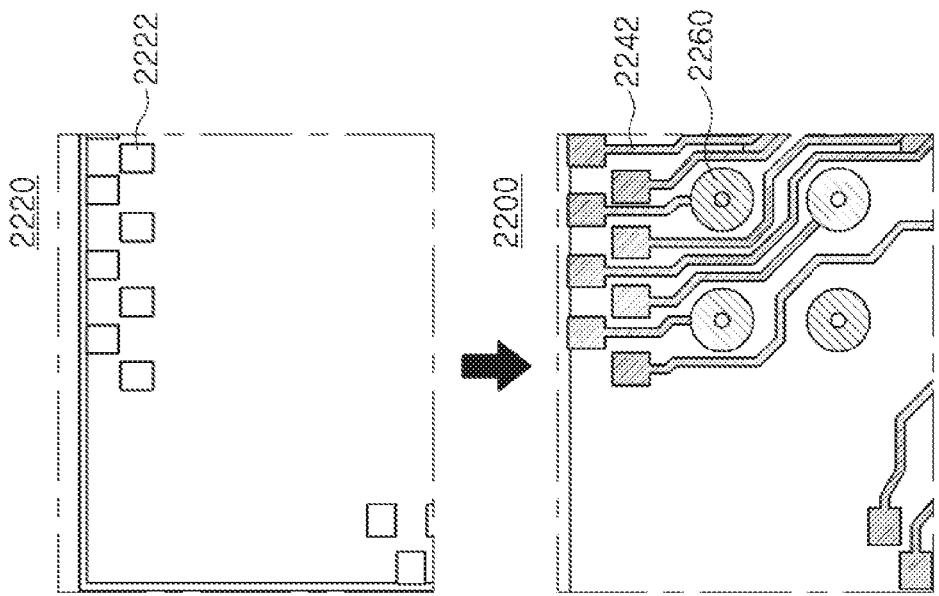
FIGS. 12A and 12B are a schematic cross-sectional view illustrating states of a fan-in semiconductor package before and after being packaged.
Figure 12A:
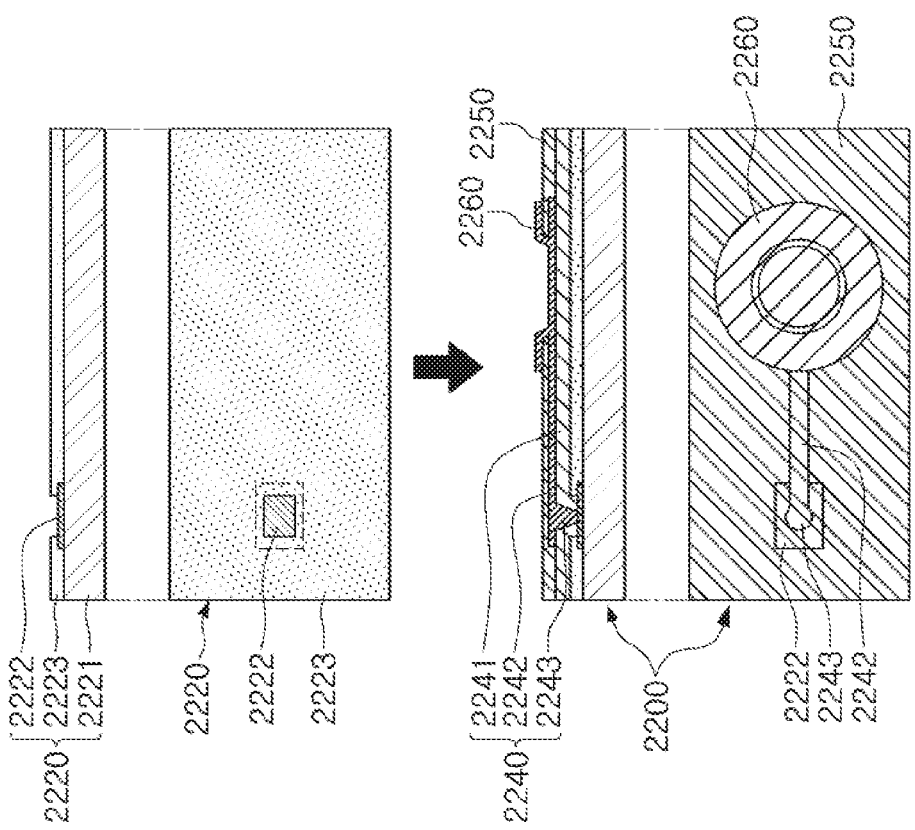

FIGS. 12A and 12B are schematic cross-sectional views illustrating states of a fan-in semiconductor package before and after being packaged.

Figure 13:
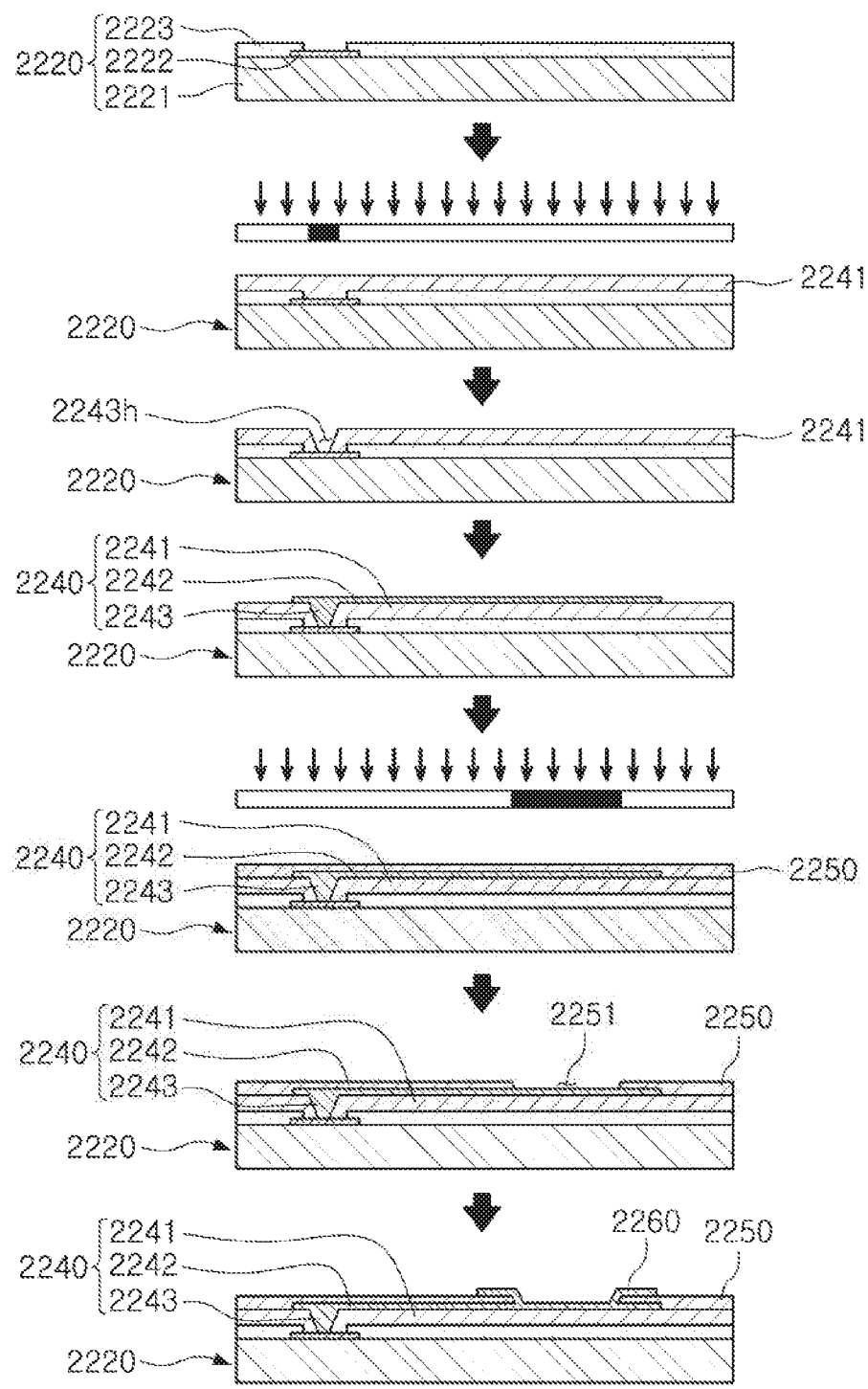
FIG. 13 is schematic cross-sectional views illustrating a packaging process of a fan-in semiconductor package.

FIG. 13 is schematic cross-sectional views illustrating a packaging process of a fan-in semiconductor package.

Referring to FIGS. 12A, 12B and 13, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 are significantly small, it is difficult to mount the integrated circuit (IC) on an intermediate level printed circuit board (PCB) as well as on the mainboard of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as photoimagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the under-bump metal layer 2260 may be manufactured through a series of processes.

As described above, the fan-in semiconductor package may have a package form in which all of the connection pads, for example, input/output (I/O) terminals, of the semiconductor chip, are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has a large spatial limitation. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. The reason is that even in a case that a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the mainboard of the electronic device.

Figure 14:
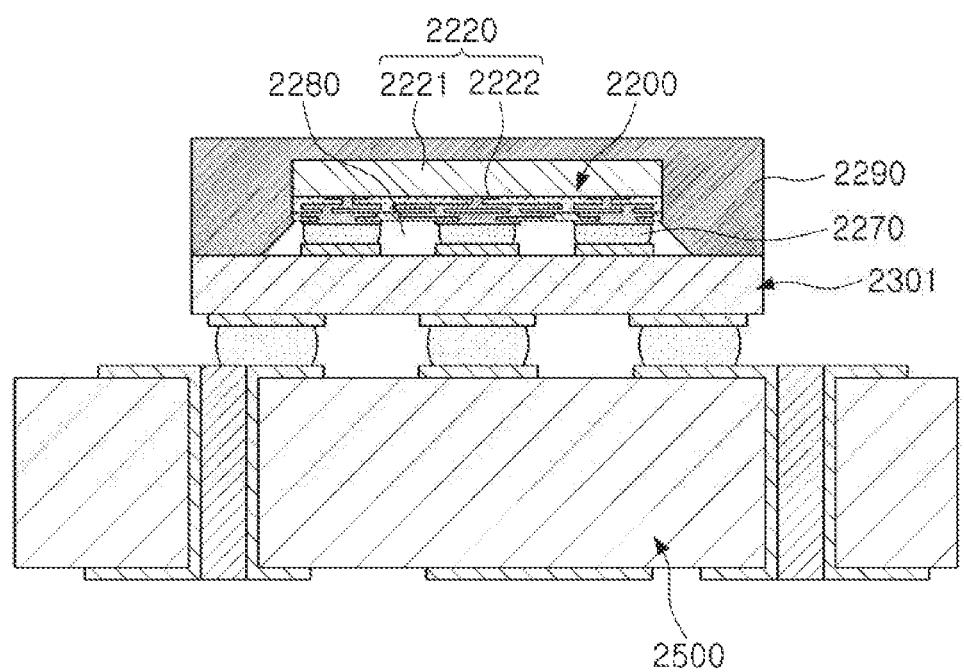
FIG. 14 is a schematic cross-sectional view illustrating a case in which a fan-in semiconductor package is mounted on an interposer substrate and is ultimately mounted on a main board of an electronic device.

FIG. 14 is a schematic cross-sectional view illustrating a case in which a fan-in semiconductor package is mounted on an interposer substrate and is ultimately mounted on a mainboard of an electronic device.

Figure 15:
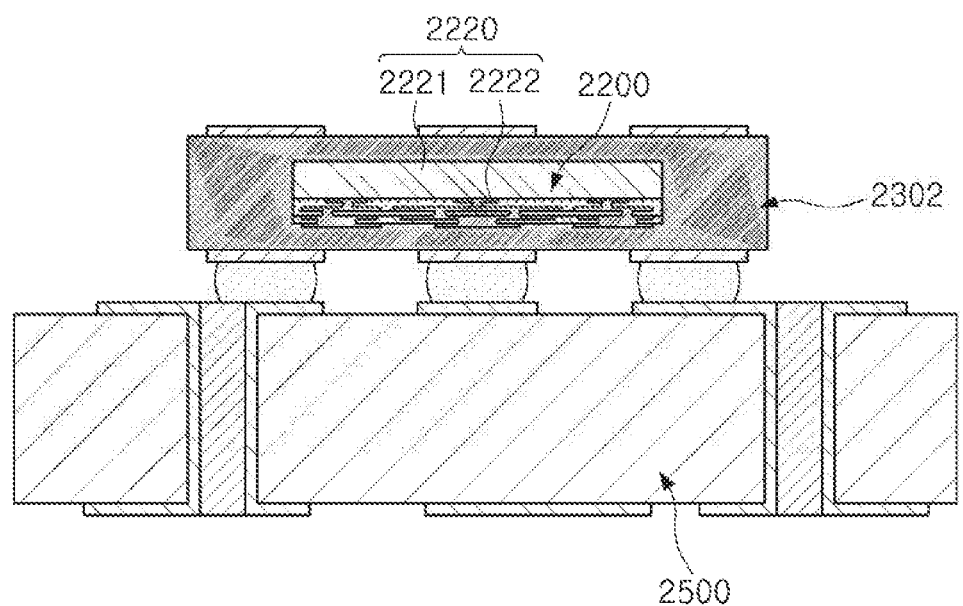
FIG. 15 is a schematic cross-sectional view illustrating a case in which a fan-in semiconductor package is embedded in an interposer substrate and is ultimately mounted on a main board of an electronic device.

FIG. 15 is a schematic cross-sectional view illustrating a case in which a fan-in semiconductor package is embedded in an interposer substrate and is ultimately mounted on a mainboard of an electronic device.

Referring to FIGS. 14 and 15, in a fan-in semiconductor package 2200, connection pads 2222, that is, I/O terminals, of a semiconductor chip 2220 may be redistributed through an interposer substrate 2301, and the fan-in semiconductor package 2200 may be ultimately mounted on a mainboard 2500 of an electronic device in a state in which it is mounted on the interposer substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may be redistributed by the interposer substrate 2302 in a state in which the fan-in semiconductor package 2200 is embedded in the interposer substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate interposer substrate and be then mounted on the mainboard of the electronic device through a packaging process or may be mounted and used on the mainboard of the electronic device in a state in which it is embedded in the interposer substrate.

Figure 16:
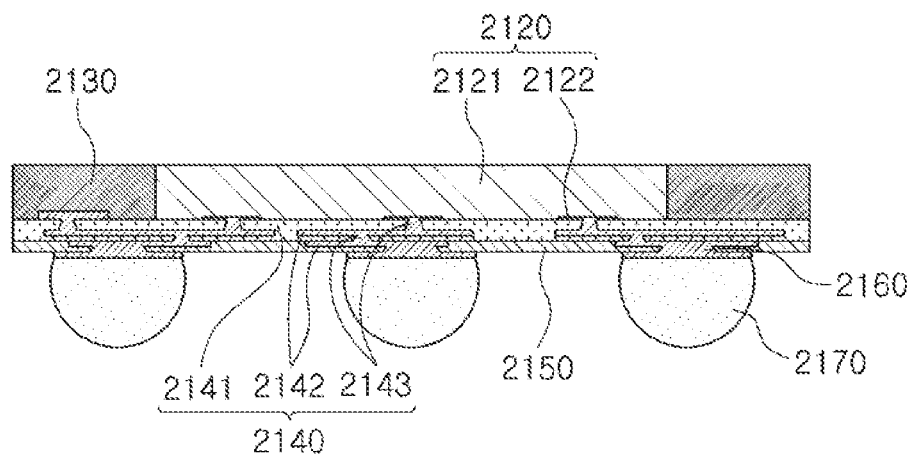
FIG. 16 is a schematic cross-sectional view illustrating a fan-out semiconductor package.

FIG. 16 is a schematic cross-sectional view illustrating a fan-out semiconductor package.

Referring to FIG. 16, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may be further formed on the connection member 2140, and an underbump metal layer 2160 may be further formed in openings of the passivation layer 2150. Solder balls 2170 may be further formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case that a size of the semiconductor chip is decreased, a standardized ball layout may be used in the fan-out semiconductor package as it is, such that the fan-out semiconductor package may be mounted on the mainboard of the electronic device without using a separate interposer substrate, as described below.

Figure 17:
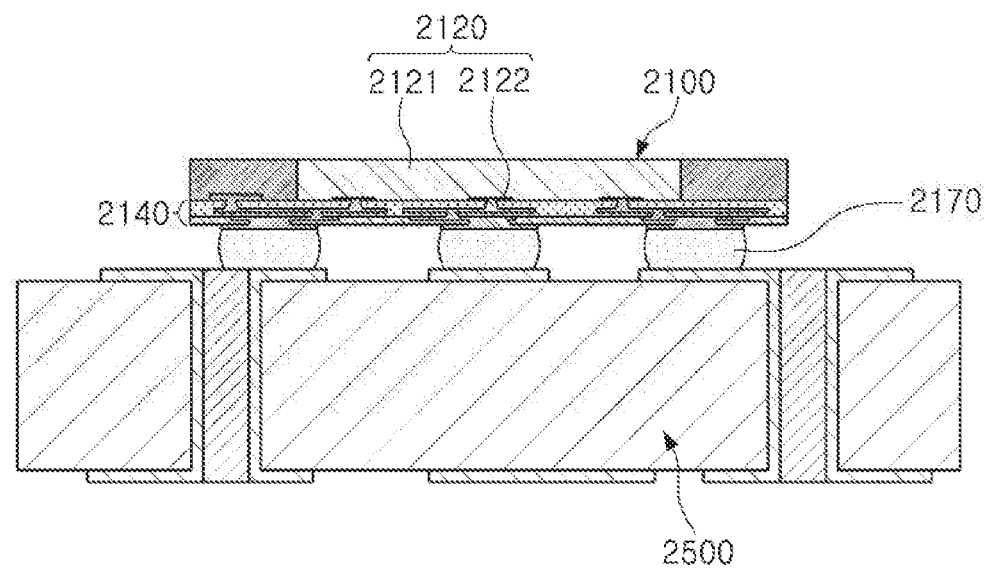
FIG. 17 is a schematic cross-sectional view illustrating a case in which a fan-out semiconductor package is mounted on a main board of an electronic device.

FIG. 17 is a schematic cross-sectional view illustrating a case in which a fan-out semiconductor package is mounted on a mainboard of an electronic device.

Referring to FIG. 17, a fan-out semiconductor package 2100 may be mounted on a mainboard 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate interposer substrate, or the like.

As described above, since the fan-out semiconductor package may be mounted on the mainboard of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

As set forth above, according to the exemplary embodiments in the present disclosure, the antenna module may be easily miniaturized while improving transmission and reception performance of the RF signal using the plurality of antenna cells providing the environment capable of easily securing antenna performance.

While exemplary embodiments have been shown and described above, it will be apparent to those skilled in the art that modifications and variations could be made without departing from the scope of the present invention as defined by the appended claims.

What is claimed is:

1. An antenna module comprising:
a connection member including at least one wiring layer and at least one insulating layer;
an integrated circuit (IC) disposed on a first surface of the connection member and connected to the at least one wiring layer; and
a plurality of antenna cells each disposed on a second surface of the connection member,
wherein each of the plurality of antenna cells includes an antenna member configured to transmit or receive a radio frequency (RF) signal, a feed via having one end connected to the antenna member and the other end connected to a corresponding wire of the at least one wiring layer, a dielectric layer surrounding side surfaces of the feed via and having a height greater than that of the at least one insulating layer, and a plating member surrounding side surfaces of the dielectric layer and insulated from the feed via and the antenna member in a respective one of the plurality of antenna cells,
wherein the dielectric layer includes an upper surface and a lower surface opposing each other,
the side surfaces of the dielectric layer are connected to the upper surface and the lower surface of the dielectric layer,
the lower surface of the dielectric layer faces the connection member,
the plating member includes a lower surface being under the dielectric layer and side surfaces surrounding the side surfaces of the dielectric layer, and
a height of the side surfaces of the plating member is greater than a height of the antenna member with respect to the second surface of the connection member.

2. The antenna module of claim 1, wherein each of the plurality of antenna cells further includes an electrical connection structure connecting between the other end of the feed via and the corresponding wire of the at least one wiring layer.

3. The antenna module of claim 1, wherein the plating member extends toward the feed via along the second surface of the connection member.

4. The antenna module of claim 1, further comprising:
an insulating member disposed on the second surface of the connection member and surrounding side surfaces of each of the plurality of antenna cells; and
an encapsulation member disposed on the plurality of antenna cells and the insulating member.

5. The antenna module of claim 4, wherein the dielectric layer has a height greater than that of the insulting member.

6. The antenna module of claim 4, wherein the dielectric layer has a dielectric constant different from that of the insulating member.

7. The antenna module of claim 1, wherein the dielectric layer has a dielectric constant different from that of the at least one insulating layer.

8. The antenna module of claim 1, wherein a dielectric constant of the dielectric layer included in a portion of the plurality of antenna cells and a dielectric constant of the dielectric layer included in other portions of the plurality of antenna cells are different from each other.

9. The antenna module of claim 1, further comprising:
an insulating member disposed on the second surface of the connection member and providing an accommodation space; and
a passive component disposed in the accommodation space and connected the corresponding wire of the at least one wiring layer.

10. The antenna module of claim 1, further comprising a core via disposed on the first surface of the connection member and connected to the corresponding wire of the at least one wiring layer,
wherein the IC receives a base signal from the core via and generates the RF signal of a millimeter wave (mmWave) band based on the base signal.

11. The antenna module of claim 1, wherein each of the plurality of antenna cells further includes a director member disposed to be spaced apart from each other in a direction opposite to a direction viewing the feed via from the antenna member and configured to transmit or receive the RF signal together with the antenna member, and
the dielectric layer further surrounds side surfaces of the antenna member and side surfaces of the director member.

12. A manufacturing method of an antenna module, the manufacturing method comprising:
manufacturing a plurality of antenna cells each including an antenna member configured to transmit or receive a radio frequency (RF) signal, a feed via having one end connected to the antenna member, a dielectric layer surrounding side surfaces of the feed via, and a plating member surrounding side surfaces of the dielectric layer;
forming holes in an insulating member as insertion spaces;
after forming the plurality of antenna cells and after forming the insertion spaces in the insulating member, respectively inserting the plurality of antenna cells into the insertion spaces provided by the insulating member such that the side surfaces of the dielectric layer respectively face inner walls of the insertion spaces; and
forming a connection member including at least one wiring layer connected to the other end of the feed via and at least one insulating layer having a height shorter than that of the dielectric layer,
wherein each of the holes has a width larger than a width of the dielectric layer.

13. The manufacturing method of claim 12, further comprising:
disposing a film below the insulating member before the plurality of antenna cells are inserted into the insertion spaces;
disposing an encapsulation member on the plurality of antenna cells and the insulating member after the plurality of antenna cells are inserted into the insertion spaces; and
removing the film before the encapsulation member is disposed and the connection member is formed.

14. An antenna module comprising:
a connection member including a wiring layer and an insulating layer;
an insulating member disposed on a first surface of the connection member and including a plurality of accommodation spaces;
a plurality of antenna cells disposed in the accommodation spaces of the connection member, respectively;
an encapsulation member encapsulating portions of the connection member and the plurality of antenna cells, and disposed in remaining portions of the accommodation spaces not occupied by the plurality of antenna cells; and
an integrated circuit (IC) disposed on a second surface of the connection member opposing the first surface and connected to the wiring layer,
wherein each of the accommodation spaces includes a hole penetrating through the insulating member,
wherein each of the plurality of antenna cells includes an antenna member configured to transmit or receive a radio frequency (FR) signal, a feed via having one end connected to the antenna member and the other end connected to a corresponding wire of the wiring layer, a dielectric layer surrounding side surfaces of the feed via,
wherein each of the accommodation spaces has a width larger than a width of the dielectric layer.

15. The antenna module of claim 14, wherein each of the plurality of antenna cells further includes a plating member surrounding side surfaces of the dielectric layer.

16. The antenna module of claim 15, wherein the dielectric layer has a height greater than that of the insulting member.

17. The antenna module of claim 15, wherein the dielectric layer has a dielectric constant higher than that of the insulating member.

18. The antenna module of claim 15, wherein the dielectric layer has a dielectric constant higher than that of the insulating layer.

19. The antenna module of claim 15, wherein the dielectric layers of two of the plurality of antenna cells have dielectric constants different from each other.

20. The antenna module of claim 14, further comprising a passive component disposed in another accommodation space of the insulating member and connected to the wiring layer,
wherein the encapsulation member covers the passive component and is disposed in a remaining portion of the another accommodation space not occupied by the passive component.

21. The antenna module of claim 14, wherein each of the accommodation spaces includes the hole penetrating through an upper surface of the insulating member and a lower surface of the insulating member opposing each other.

* * * * *